(12) United States Patent
Takahashi et al.

(10) Patent No.: US 8,212,363 B2
(45) Date of Patent: *Jul. 3, 2012

(54) MULTILAYER PRINTED WIRING BOARD

(75) Inventors: Michimasa Takahashi, Gifu (JP);
Yukinobu Mikado, Gifu (JP);
Takenobu Nakamura, Gifu (JP);
Masakazu Aoyama, Gifu (JP)

(73) Assignee: Ibiden Co., Ltd., Ogaki-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/819,805

(22) Filed: Jun. 21, 2010

(65) Prior Publication Data

US 2010/0252318 A1    Oct. 7, 2010

Related U.S. Application Data

(63) Continuation of application No. 11/480,824, filed on Jul. 6, 2006, now Pat. No. 7,834,273.

(30) Foreign Application Priority Data

Jul. 7, 2005   (JP) .................................. 2005-199443

(51) Int. Cl.
*H01L 23/48* (2006.01)
(52) U.S. Cl. .................. 257/774; 257/E23.062
(58) Field of Classification Search .................. 257/774, 257/E23.062; 174/250
See application file for complete search history.

(56) References Cited

U.S. PATENT DOCUMENTS

| | | | |
|---|---|---|---|
| 3,471,631 A | 10/1969 | Quintana | |
| 5,440,075 A | 8/1995 | Kawakita et al. | |
| 5,473,120 A | 12/1995 | Ito et al. | |
| 5,484,647 A | 1/1996 | Nakatani et al. | |
| 5,639,389 A | 6/1997 | Schmidt et al. | |
| 5,662,987 A | 9/1997 | Mizumoto et al. | |
| 5,874,770 A | 2/1999 | Saia et al. | |
| 6,326,559 B1 | 12/2001 | Yoshioka et al. | |
| 6,326,694 B1 | 12/2001 | Hatakeyama et al. | |
| 6,440,542 B1 | 8/2002 | Kariya | |
| 6,534,723 B1 | 3/2003 | Asai et al. | |
| 6,571,467 B2 | 6/2003 | Haze et al. | |
| 6,631,558 B2 | 10/2003 | Burgess | |
| 6,766,576 B2 | 7/2004 | Haze et al. | |
| 6,977,348 B2 | 12/2005 | Ho et al. | |
| 7,759,582 B2 | 7/2010 | Takahashi et al. | |
| 2003/0135994 A1 | 7/2003 | Shutou et al. | |
| 2004/0173891 A1 | 9/2004 | Imai et al. | |

(Continued)

FOREIGN PATENT DOCUMENTS

CN    1346309 A    4/2002

(Continued)

*Primary Examiner* — Victor A Mandala
*Assistant Examiner* — Krista Soderholm
(74) *Attorney, Agent, or Firm* — Oblon, Spivak, McClelland, Maier & Neustadt, L.L.P.

(57) ABSTRACT

A multilayer printed wiring board including insulating layers, conductor layers stacked alternately over the insulating layers, respectively, and viaholes formed in the insulation layers and electrically connecting the conductor layers through the insulation layers. The viaholes include a first group of viaholes and a second group of viaholes. The viaholes in the first group are tapered toward the viaholes in the second group, and the viaholes in the second group are tapered toward the viaholes in the first group. The viaholes in the first group and the the viaholes in the second group are formed in the insulating layers, respectively, and the viaholes are formed by plating openings formed after lamination of respective ones of the insulating layers, and each of the insulating layers is about 100 μm or less in thickness.

20 Claims, 7 Drawing Sheets

U.S. PATENT DOCUMENTS

| | | |
|---|---|---|
| 2005/0095835 A1 | 5/2005 | Humpston et al. |
| 2010/0155130 A1 | 6/2010 | Takahashi et al. |

FOREIGN PATENT DOCUMENTS

| | | |
|---|---|---|
| CN | 1404120 A | 3/2003 |
| CN | 1433256 A | 7/2003 |
| EP | 1 194 022 A1 | 4/2002 |
| JP | 3-75557 | 7/1991 |
| JP | 6-104545 | 4/1994 |
| JP | 8-116174 | 5/1996 |
| JP | 8-125332 | 5/1996 |
| JP | 9-293968 | 11/1997 |
| JP | 10-13028 | 1/1998 |
| JP | 11-261232 | 9/1999 |
| JP | 2000-133943 | 5/2000 |
| JP | 2000-252628 | 9/2000 |
| JP | 2001-68809 | 3/2001 |
| JP | 2001-77497 | 3/2001 |
| JP | 2001-168481 | 6/2001 |
| JP | 2001-217550 | 8/2001 |
| JP | 2002-26521 | 1/2002 |
| JP | 2002-314245 | 10/2002 |
| JP | 2003-218519 | 7/2003 |
| JP | 2003-229666 | 8/2003 |
| JP | 2005-26406 | 1/2005 |
| JP | 2005-072328 | 3/2005 |
| JP | 2005-183466 | 7/2005 |
| TW | 558932 B | 10/2003 |
| TW | I232712 | 5/2005 |
| WO | WO 01/42006 A1 | 6/2001 |
| WO | 2004/088731 A2 | 10/2004 |

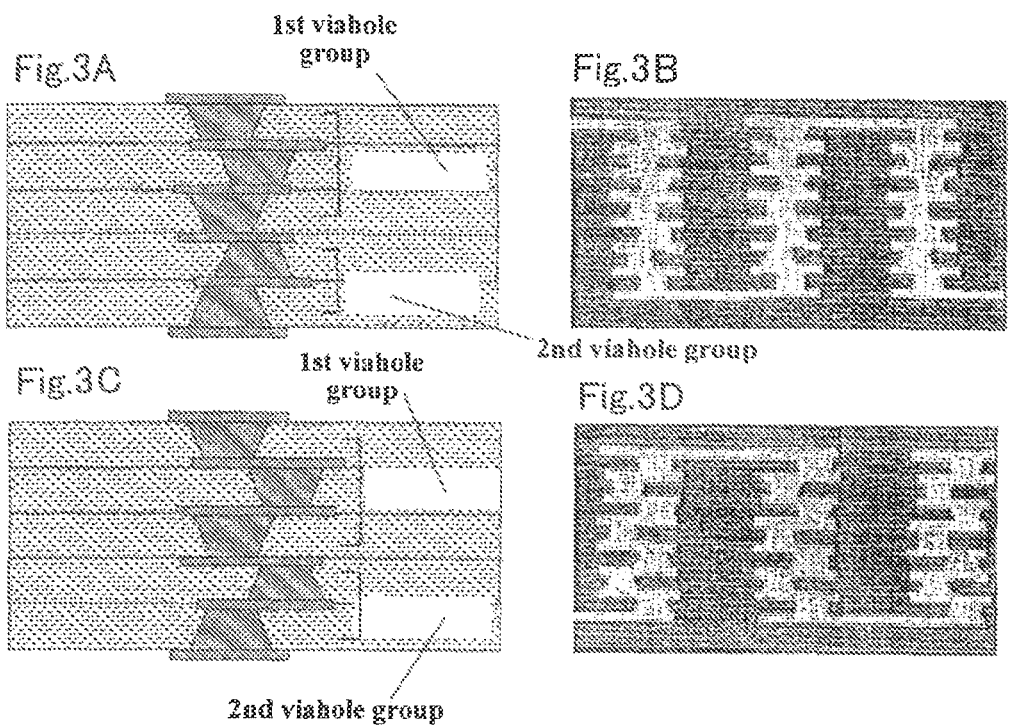
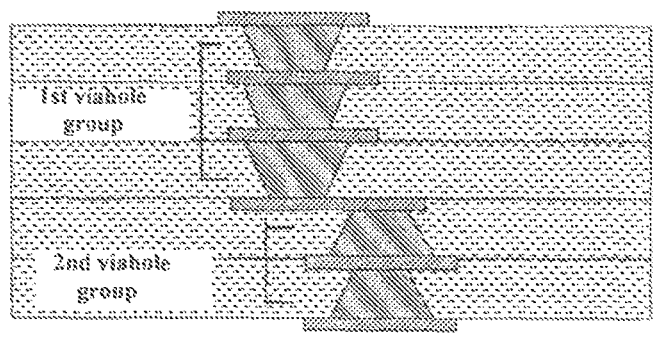

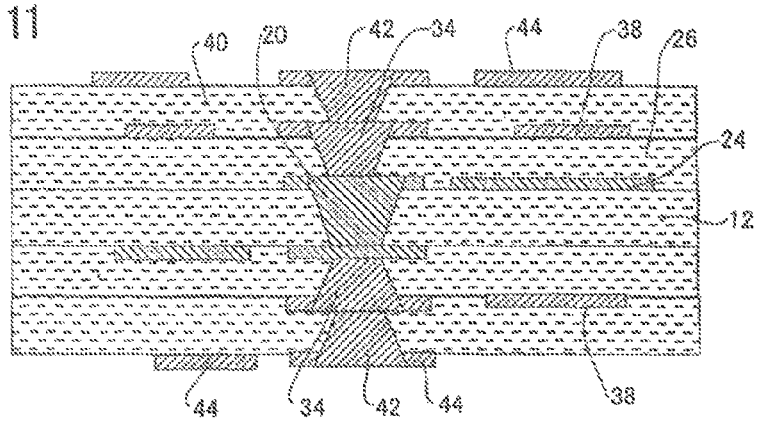
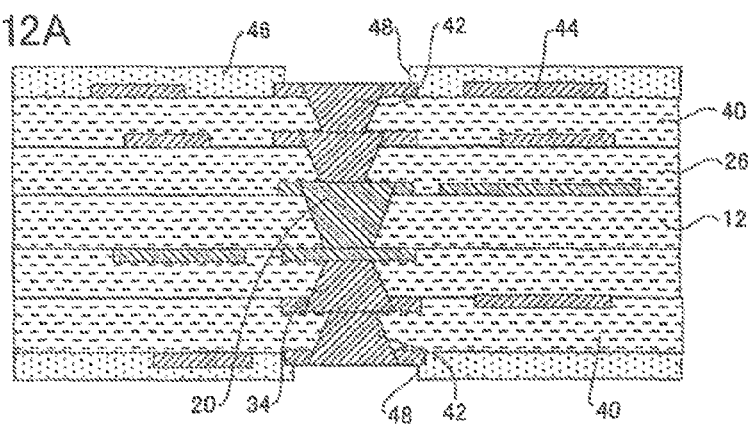
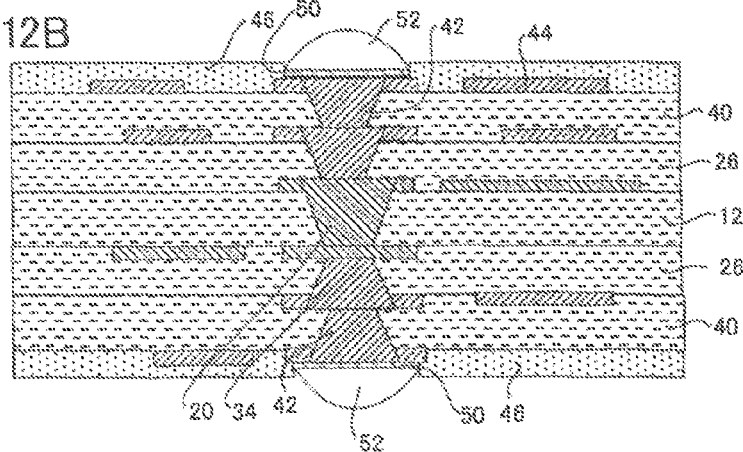

MULTILAYER PRINTED WIRING BOARD

CROSS-REFERENCE TO RELATED APPLICATIONS

This application is a continuation of and claims benefit of priority from U.S. application Ser. No. 11/480,824, filed Jul. 6, 2006, the entire contents of which are hereby incorporated by reference. U.S. application Ser. No. 11/480,824 claims benefit of priority from Japanese Application No. 2005-199443, filed Jul. 7, 2005.

FIELD OF THE INVENTION

The present invention relates to a multilayer printed wiring board for mounting electronic components such as a capacitor, IC and the like on the surface layer thereof.

BACKGROUND ART

The recent portable electronic devices such as a mobile phone, digital camera, etc., use a multilayer printed wiring board having electronic components such as a capacitor, IC and the like mounted on the surface layer thereof.

More specifically, the electronic components to be mounted on such a wiring board are passive parts such as an IC chip, capacitor, resistor, inductor and the like, a liquid crystal device, a display device for digital indication, control devices such as keypad, switches and the like or external terminals such as a USB, earphone and the like.

Various conductor pads corresponding to electronic components are provided together on a printed circuit board, a solder body is formed on each of the conductor pads, and the electronic components are mounted on the solder bodies on the conductor pads.

A typical one of multilayer circuit boards on which the above electronic components are to be mounted is disclosed in the Japanese unexamined patent publication No. H10-13028. As disclosed in the above Japanese unexamined patent publication No. H10-13028, holes for viaholes are formed by lasering, in an insulating rigid substrate having a conductor circuit formed on one side or either side thereof, viaholes are formed by filling a metal paste or a plating material in the holes to form an interlayer-connected circuit board, and two or more such circuit boards prepared as above are stacked sequentially or collectively to produce a multilayer printed wiring board.

In such a multilayer circuit board, two circuit boards are electrically connected to each other by connecting a viahole or a land of the viahole in one of the adjacent circuit boards to a conductor circuit or land of the other circuit board.

Also, the circuit boards are joined, at other areas thereof not contributing to electrical connection between them, to each other with an adhesive layer, prepreg or the like of a thermosetting resin, to thereby form a multilayer structure.

Normally, a solder resist layer to protect the conductor circuit is formed on the surface layer of the above multilayer circuit board or prevailing printed wiring board, a hole is formed in a part of the solder resist layer, and a corrosion-resistant layer of gold or nickel is formed on the surface, exposed in the hole, of the conductor circuit. A solder body such as a solder bump is formed on the surface, having the corrosion-resistant layer formed thereon, of the conductor circuit, and an electronic component such as a capacitor, IC or the like is mounted on the solder bodies formed on the conductor circuit surface.

BRIEF SUMMARY OF THE INVENTION

The inventors of the present invention have devoted themselves to the studies in this field of technology for implementing the above multilayer printed wiring board. Taking into consideration the shape and stacked pattern of viaholes electrically connecting conductor circuits to each other in the multilayer wiring board, the inventors took the viaholes formed in one of two outermost insulating layers and another insulating layer disposed inside the one insulating layer as ones belonging to a first group and those formed in the other of the two outermost insulating layers and still another insulating layer disposed inside the other insulating layer as ones belonging to a second group, and tapered each of the viaholes included in each group and stacked in such geometry that the groups were opposite to each other toward the surface of an insulating substrate in which the viahole were formed or toward the surface of the conductor circuit formed on the insulating substrate. With this arrangement, the inventors found that the printed circuit board would not be reduced in rigidity, warped or otherwise influenced even if the insulating substrates included in the printed circuit board was reduced in thickness. Based on these findings, the inventors worked out the present invention which will be described below.

According to one embodiment of the present invention, there is provided a multilayer printed wiring board in which insulating layers and conductor layers are stacked alternately on each other and the conductor layers are electrically connected to each other through viaholes formed in the insulation layers, wherein the viaholes include a first group of viaholes which are formed in one of two outermost insulating layers and another insulating layer disposed inside the one insulating layer and a second group of viaholes which are formed in the other of the two outermost insulating layers and still another insulating layer disposed inside the other insulating layer, each of the viaholes included in the first and second groups is formed tapered to have a diameter which is smaller in the direction of thickness of the insulating layer, and the insulating layer is about 100 μm or less in thickness.

According to other embodiment of the present invention, there is also provided a multilayer printed wiring board in which one insulating substrate having at least one conductor circuit formed thereon has stacked on either side thereof at least one or more other insulating substrates having at least one conductor circuit formed thereon and the conductor circuit formed on the one insulating substrate and that on the other insulating substrate are electrically connected to each other through viaholes formed in the insulating substrates, wherein the viaholes formed in the other insulating substrate stacked on one side of the one insulating substrate form together a first group including viaholes each formed tapered toward the surface of the insulating substrate or that of the conductor circuit formed on the surface of the insulating substrate, while the viaholes formed in the other insulating substrate stacked on the other side of the one insulating substrate form together a second group including viaholes each formed tapered toward the surface of the insulating substrate or that of the conductor circuit formed on the surface of the insulating substrate, and the insulating substrate is about 100 μm or less in thickness.

According to still other embodiment of the present invention, there is also provided a multilayer printed wiring board in which an inner insulating substrate having at least one conductor circuit formed thereon has stacked on either side thereof at least one or more outer insulating substrates having at least one conductor circuit formed thereon and the conductor circuit formed on the inner insulating substrate and that on the outer insulating substrate are electrically connected to each other through viaholes formed in each of the insulating substrates, wherein the viaholes formed in the outer insulating substrate stacked on one side of the inner insulating substrate form together a first group including viaholes formed tapered toward the surface of the insulating substrate or that of the conductor circuit formed on the surface of the insulating substrate while the viaholes formed in the outer insulating substrate stacked on the other side of the inner insulating substrate form together a second group including viaholes formed tapered toward the surface of the insulating substrate or that of the conductor circuit formed on the surface of the insulating substrate, and the inner or outer insulating substrate is about 100 μm or less in thickness.

In the above multilayer printed wiring boards according to the embodiments of the present invention, the insulating layer or insulating substrate may be about 50 μm or less in thickness.

Also in the above multilayer printed wiring boards according to the embodiments of the present invention, the first group of viaholes may be stacked on the second group of viaholes in such geometry that it is opposite to the second group of viaholes to form a multistage stacked vias structure. Otherwise, the first group of viaholes may be stacked on the second group of viaholes in such geometry that it is shifted in relation to the second group of viaholes in a direction generally orthogonal to the direction of thickness of the insulating layer.

Also in the above multilayer printed wiring boards according to the embodiments of the present invention, the viaholes in the first or second group may be stacked on an almost straight line. Otherwise, the viaholes may be stacked together in such geometry that they are shifted from each other in a direction generally orthogonal to the direction of thickness of the insulating layer.

Also in the above multilayer printed wiring boards according to the embodiments of the present invention, the viaholes included in either the first or second group may be positioned at two opposite apexes of an imaginary tetragonal lattice on the insulating substrate while the viaholes included in the other group may be positioned at other two opposite apexes of the imaginary tetragonal lattice on the insulating layer.

Also in the above multilayer printed wiring boards according to the embodiments of the present invention, the viaholes included in either the first or second group may be positioned at apexes of an imaginary tetragonal or triangular lattice on the insulating substrate while the viaholes included in the other group may be positioned at the center of the imaginary tetragonal or triangular lattice on the insulating layer.

Also in the above multilayer printed wiring boards according to the embodiments of the present invention, the viaholes included in either the first or second group may be positioned intensively in a predetermined area of the insulating substrate while the viaholes included in the other group may be positioned in a peripheral area surrounding the predetermined area of the insulating layer.

Also in the above multilayer printed wiring boards according to the embodiments of the present invention, each of the viaholes may be tapered at an inner angle of about 60 to about 90 degrees toward the surface of the insulating substrate in which the viahole is formed or the surface of the conductor circuit formed on the surface of the insulating layer.

Also in the above multilayer printed wiring boards according to the embodiments of the present invention, each of the viaholes may be formed by filling a plating material in a hole formed in the insulating substrate.

Also in the above multilayer printed wiring boards according to the embodiments of the present invention, the viaholes included in the first and second groups may form a multistage stacked vias structure.

According to the other embodiment of the present invention, there is also provided a multilayer printed wiring board in which insulating layers and conductor layers are stacked alternately on each other and the conductor layers are electrically connected to each other through viaholes formed in the insulating layers, wherein: the insulating layers are at least three in number and about 100 μm or less in thickness; the viaholes include a first group of viaholes and a second group of viaholes; the first group includes viaholes in more than two stages of stacked vias extending in the direction of thickness of the insulating layer and inwardly of the multilayer printed wiring board; and the second group includes viaholes formed tapered to have a diameter which is smaller away from the first viahole group in the direction of thickness of the insulating layer.

In the above multilayer printed wiring board according to the above embodiment of the present invention, the insulating layer may be about 50 μm or less.

BRIEF DESCRIPTION OF THE DRAWINGS

FIG. 3A is a schematic sectional view of a variant of the multistage stacked vias, FIG. 3B is a SEM photograph showing the section of the substrate, FIG. 3C is a schematic sectional view of another variant of the multistage stacked vias, and FIG. 3D is a SEM photograph showing the section of the substrate.

FIG. 4 is a schematic sectional view of another basic shape of the multistage stacked vias in the multilayer printed wiring board according to the present invention.

FIG. 11 is a schematic sectional view of the multilayer printed wiring board as the embodiment 1 of the present invention, showing another step in the manufacturing process for the multilayer printed wiring board.

FIGS. 12A and 12B are schematic sectional views of the multilayer printed wiring board as the embodiment 1 of the present invention, showing further steps in the manufacturing process for the multilayer printed wiring board.

DETAILED DESCRIPTION OF THE EMBODIMENTS

Figure 1:
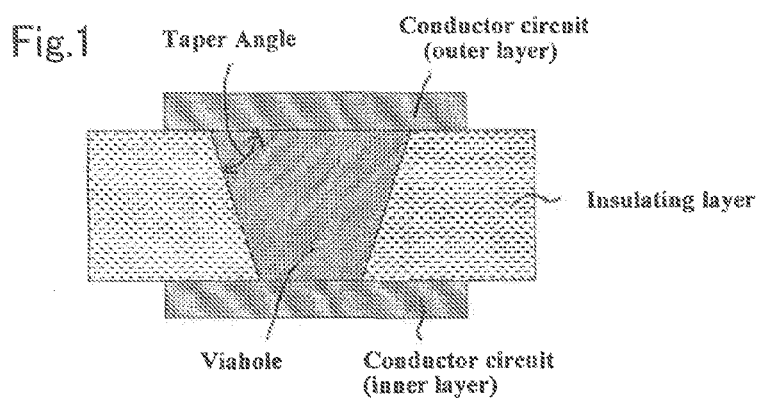
FIG. 1 is a schematic sectional view of the multilayer printed wiring board according to the present invention, showing the tapering of a viahole formed in the printed wiring board.

The multilayer printed wiring board as one embodiment of the present invention is such that viaholes to electrically connect conductor layers stacked together via an insulating layer include a first group of viaholes formed in at least one insulating layer stacked inside one of two outermost insulating layers and a second group of viaholes formed in a least one insulating layer stacked inside of the other of the two outermost insulating layers, the viaholes included in the first and second groups are formed tapered to have a diameter which is smaller in the direction of thickness of the insulating layer, and the insulating layer is about 100 μm or less in thickness.

Namely, in the multilayer printed wiring board as a lamination formed from the conductor layers and insulating layers stacked alternately on one another, a multistage stacked vias are formed in which the viaholes formed in at least one insulating layer stacked inside one of the two outermost insulating layers (first viahole group) and those formed in at least one insulating layer stacked inside the other of the two outermost insulating layers (second viahole group) are positioned opposite to each other, the viaholes included in the multistage stacked vias are tapered toward the surface of the insulating layer or that of the conductor layer formed on the surface of the insulating layer, and each of the insulating substrates is about 100 μm or less in thickness.

In the above multilayer printed wiring board as the embodiment of the present invention, the multistage stacked vias are formed in which the first group of viaholes formed in an insulating layers as the core of stacking and an insulating layer stacked on one side of the former insulating layer and the second group of viaholes formed in an insulating layer stacked on the other side of the insulating layer as the core of stacking, the viaholes in each of the groups are tapered to have a diameter which is smaller in the direction of thickness of the insulating layer, that is, tapered toward the surface of the insulating layer or that of the conductor circuit formed on the insulating layer. Thus, even if the stacked insulating layer or substrate is about 100 μm or less in thickness, it can be prevented from being warped due to an external stress (such as an impact caused by dropping or the like). As a result, the printed circuit board can have a satisfactory reliability and drop-shock resistance.

Also, the multistage stacked vias formed in the insulating layers will function as a stake to make it difficult for the insulating layers or insulating substrates to be warped. Therefore, the substrates will be able to keep their flatness, so that the multilayer printed wiring board can maintain the reliability provable by the reliability test such as a heat cycle test.

Especially, a printed circuit board can advantageously be formed by forming a conductor circuit on an insulating layer or substrate of about 100 μm or less in thickness and stacking more than one such an insulating layer or substrate together.

Further, a printed circuit board can advantageously be formed by forming a conductor circuit on an insulating layer or substrate of about 50 μm or less in thickness and stacking more than one such an insulating layer or substrate together. It can be inferred that the printed circuit board will incur less reduction of its reliability and drop-shock resistance.

Also, the multistage stacked vias formed in such geometry that the first and second viahole groups are opposite to each other effectively prevents the insulating layers or substrates from being warped both outwardly and inwardly of them. As a result, the printed circuit board can have a satisfactory reliability and drop-shock resistance.

Also, the multistage stacked vias disposed opposite to each other assure a satisfactory rigidity of the insulating substrates themselves.

Various embodiments of the multilayer printed wiring board according to the present invention will be described in detail below with reference to the accompanying drawings:

The insulating layer or substrate used in the multilayer printed wiring board according to the present invention should be a rigid substrate selected from among, for example, glass cloth-based epoxy resin, phenol resin, glass cloth-based bismaleimide triazine resin, glass cloth-based polyphenylene ether resin, aramid unwoven cloth-based epoxy resin, aramid unwoven cloth-based polyimide resin, etc. The substrate of such an insulating resin should desirably be about 100 μm or less in thickness. Also, the substrate of such an insulating resin may be about 50 μm or less in thickness.

A multilayer printed wiring board (printed circuit board for mounting electrical components) is formed by stacking such insulating layers or substrates alternately on the surface of a circuit board as the core of stacking, in which at least one conductor circuit is formed on one or both of the surfaces of the insulating layer or substrate. Also, the thickness of the multilayer printed circuit board itself can be reduced by reducing the thickness of all the insulating layers or substrates in such a printed circuit board to about 100 μm or less.

Also, in the embodiment of the present invention, both the conductor circuits formed on the insulating substrates and the viaholes (multistage stacked vias) included the first and second groups should desirably be formed by plating.

The viahole is formed by electrolytic or electroless plating. The metal used for plating may be an element such as copper, nickel, iron, cobalt or the like or an alloy based on any of the elements.

In the embodiment of the present invention, the multistage stacked vias include viaholes formed tapered to have a diameter which is smaller in the direction of thickness of the insulating layers having the viaholes formed therein, tapered toward the surface of the insulating substrate or that of the conductor layer formed on the surface of the insulating substrate, or tapered from outside toward inside of the stacked insulating layers, as shown in FIG. 1.

Typically, the multistage stacked vias should desirably be formed generally as a truncated cone whose top is larger in area than the bottom and section (generally trapezoidal) tapered in the direction of thickness of the insulating substrate has an inner angle of about 60 to about 90 degrees.

It is inferred that with the inner angle being within the above range, the insulating substrate can be limited without cancellation of the anchoring effect of the multistage stacked vias.

Figure 2A:
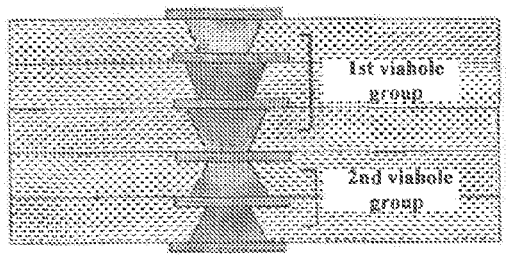
FIG. 2A is a schematic sectional view of a multistage stacked vias in the multilayer printed wiring board according to the present invention.
Figure 2B:
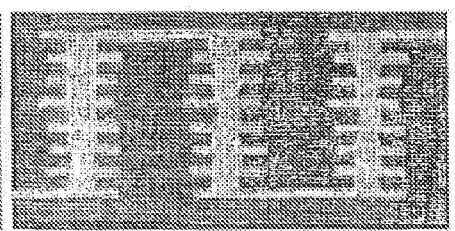
FIG. 2B is a SEM photograph showing the section of a substrate having the multistage stacked vias.

The viahole diameter at the bottom of the multistage stacked vias (will be referred to as "via-bottom diameter" hereunder) may be at least about 10 μm. The reason for the above is that since the viahole is formed by plating, the via-bottom diameter should be at least about 10 μm for that plating. Thus, the upper conductor layer (upper conductor circuit and viahole) and lower conductor layer can electrically be connected to each other In the embodiment of the present invention, the multistage stacked vias should preferably be formed so that the bottoms of outer viaholes (upper viaholes) are superposed on those of inner viaholes (lower viaholes) in the same position. That is, the viaholes in the first and second groups can be formed on almost same straight lines, respectively, as shown in FIGS. 2A and 2B.

Also, as long as the bottom of the upper viahole and that of the lower viahole overlap each other, the multistage stacked vias can perform the function assured by its tapered shape. Further, in the first or second group, the viaholes may be stacked together in respective positions shifted in a direction in which they are perpendicular to each other in the direction of thickness of the insulating layers and where the bottoms of the viaholes overlap at least partially each other.

For example, the viaholes in the first or second group may be stacked in respective positions where they are shifted about a half of their diameter from each other as shown in FIGS. 3A and 3B. Also, the viaholes in the first or second group may be stacked in respective positions where they are shifted generally one viahole diameter from each other, as shown in FIGS. 3C and 3D.

Also in case the multilayer printed wiring board is used as usual, the multistage stacked vias can perform the function assured by its tapered shape.

Also, in the embodiment of the present invention, the first or second group of viaholes included in the multistage stacked vias should preferably be formed by providing at least two or more insulating substrates and stacking the viaholes formed in the insulating substrates together. That is, the first or second viahole group may be formed by stacking three, four or more viaholes together.

In the multistage stacked vias, the first and second viaholes groups may be equal in number of viahole layers to each other (e.g., three viahole layers in the first group and three viahole layers in the second group) or may be different in number of viahole layers from each other (e.g., two viahole layers in the first group and three viahole layers in the second group). Basically, the interlayer electrical connection and reliability of the printed circuit board can be assured by forming the first and second viahole groups in the multistage stacked vias in such geometry that they are opposite to each other.

In the embodiment of the present invention, the multistage stacked vias may be an electrically conductive layer. But it may also be an electrically nonconductive layer, that is, a dummy conductor layer. In case the multistage stacked vias are formed from a dummy conductor layer, it will be assured that conductor layers other than the dummy layer (conductor layers existing around the dummy conductor layer or conductor layers electrically connected to each other by the viahole in the multistage stacked vias or the like) will provide the same effect as the electrically conductive layer does.

Also in the embodiment of the present invention, the first and second viahole groups included in the multistage stacked vias should desirably be disposed in the generally same positions (on the nearly same lines) within an area where the conductor circuit of each insulating substrate is formed as shown in FIGS. 2A and 2B or disposed in respective positions shifted from each other (dispersed disposition) as shown in FIGS. 3A to 3D.

By dispersing the first and second viahole groups uniformly in the entire area of the insulating substrates, for example, it is possible to assure a satisfactory resistance of the insulating substrates against a warp caused by an external stress.

Also, by concentrically disposing the first and second viahole groups mainly in the central portion of the insulating substrate which is likely to be most influenced by an external stress, it is possible to assure a satisfactory resistance of the insulating substrates against a warp of the insulating substrates caused by an external stress.

Also, the first and second viahole groups may be disposed not in the central portion of the insulating substrate but mainly in a peripheral area surrounding that central portion. Such a disposition of the first and second viahole groups permits to assure the satisfactory resistance of the insulating substrates against the warp. Also it is possible to assure a satisfactory flatness of the printed circuit board.

Further, mainly in the central portion of the insulating substrate, the first and second viahole groups may be disposed opposite to each other, while in the peripheral portion, the first and second viahole groups may be disposed in respective positions shifted from each other.

The multistage stacked vias are disposed in any of various patterns of disposition in plane, such as a tetragonal lattice (as in FIGS. 5A to 5C), triangular lattice (as in FIG. 6) or straight line (as in FIG. 7) in addition to the aforementioned patterns.

Figure 5A:
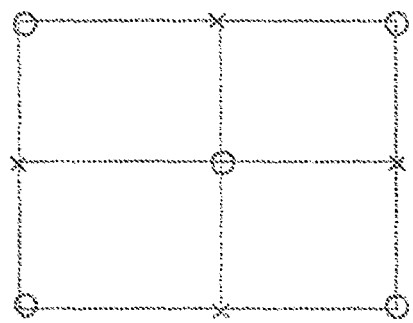
FIGS. 5A to 5C schematically illustrate examples of disposition in plane of viaholes included in a multistage stacked vias.
Figure 5B:
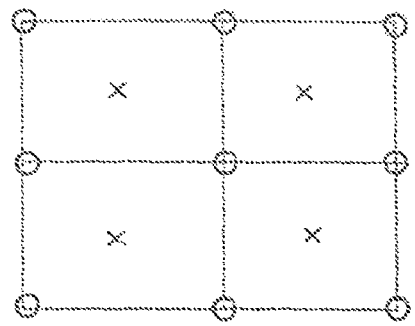
Figure 5C:
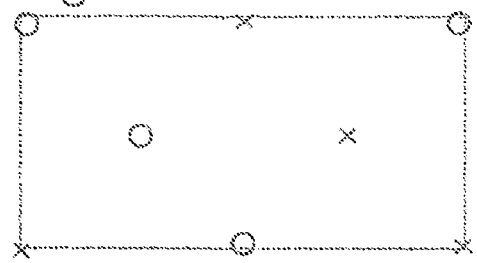

In the disposition in the tetragonal lattice pattern, the viaholes are disposed as follows. For example, the first and second viahole groups are disposed regularly in an imaginary tetragonal matrix as shown in FIG. 5A. The first viahole groups are disposed in an imaginary matrix while the second viahole groups opposite to the first ones are disposed in an intermediate portion of the matrix, as shown in FIG. 5B. Otherwise, the first and second viahole groups are disposed regularly in an imaginary zigzag matrix as shown in FIG. 5C.

Figure 6:
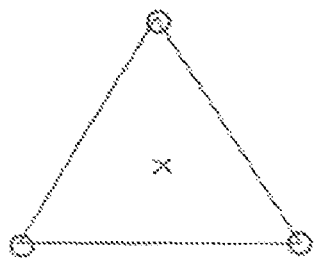
FIG. 6 schematically illustrates another example of disposition in plane of viaholes included in a multistage stacked vias (disposition in the form of a triangular lattice).

In the disposition in the triangular lattice pattern, for example, the first viahole groups are disposed in an imaginary triangular pattern while the second viahole groups opposite to the first ones are disposed near the center, or at the center of gravity, of the triangle, as shown in FIG. 6.

Figure 7:
FIG. 7 schematically illustrates another example of disposition in plane of viaholes included in a multistage stacked vias (disposition in straight lines).

Also, the viaholes may be disposed on the straight lines. For example, at least two first groups of viaholes are disposed on an imaginary straight line while a second viahole group opposite to the first viahole groups is disposed at the center of the straight line, as shown in FIG. 7.

Also, the multistage stacked vias may be formed in a combination of two or more of the above-mentioned patterns of viahole disposition.

Further, in the embodiment of the present invention, for example, the second viahole groups may be disposed opposite to each other in areas where no first viahole groups are disposed, which disposition pattern may be added to the above-mentioned ones. Namely, the first viahole groups may be disposed in a plane of matrix while the second viahole groups may be disposed in a matrix in areas where no first viahole groups are disposed. Alternatively, the first viahole groups may be disposed mainly in the central portion of a substrate while the second viahole groups may be disposed around the substrate (as in FIG. 8A).

Note that in FIGS. 5 to 8, the first viahole groups are indicated with a small circle (o) and the second viahole groups are indicated each with a crisscross (x) but the viahole groups (first groups, for example) may be displaced in other groups' (second groups, for example) positions. The first and second viahole groups may be equal or different in diameter to or from each other.

There will be described in detail below one example of the method of producing a multilayer printed wiring board as an embodiment of the present invention.

(1) A starting material for producing the multilayer printed wiring board as the embodiment of the present invention may be a circuit board used as a basic unit for the multilayer printed wiring board and having attached a copper foil on one or either side of an insulating substrate thereof.

The insulating substrate is a rigid one selected from among, for example, glass cloth-based epoxy resin, glass cloth-based bismaleimide triazine resin, glass cloth-based polyphenylene ether resin, aramid unwoven cloth-based epoxy resin, aramid unwoven cloth-based polyimide resin, etc. The most desirable one is the glass cloth-based epoxy resin substrate.

The insulating substrate should desirably be about 100 μm or less in thickness. Also, the insulating substrate may be about 50 μm or less in thickness.

According to the present invention, a hole for forming a viahole may be formed by lasering in the circuit board by either a direct lasering method in which lasering is made to form a hole through a copper foil and insulating substrate at a time or a conformal method in which a copper foil is etched to remove a portion thereof corresponding to a viahole and then a hole is formed by lasering in the insulating substrate.

The copper foil attached over the insulating substrate should desirably be about 5 to about 20 μm in thickness.

The above range of the copper foil thickness assures that the end face of the copper foil in the position of a viahole will not be deformed when a hole for the viahole is formed in the insulating substrate, a conductor circuit having a predetermined shape can easily be formed and a circuit board pattern having fine line width can easily be formed by etching.

The copper foil may be adjusted in thickness by a half etching. In this case, the copper foil thickness may be larger than the above and the thickness of the etched copper foil is adjusted to within the above range.

Also, in case a double-side copper-clad laminate is used as the circuit board, the copper thickness may be within the above range but the copper foil may be different in thickness from one side to the other of the circuit board as long as the thickness is within that range, whereby it is possible to proceed with subsequent steps of the manufacturing process smoothly.

The circuit board should preferably be formed from a single- or double-sided copper-clad laminate produced by hot-pressing of a stack of a copper foil and a B-stage prepreg as an insulating substrate formed by impregnating epoxy resin into a glass cloth.

The reason for the above is that the wiring pattern and viaholes can accurately be positioned without displacement thereof in subsequent steps of the manufacturing process after the copper foil is etched.

(2) Next, holes for viaholes are formed by lasering in the insulating substrate.

In case a single-sided copper-clad laminate is used to form the circuit board, the surface of the insulating substrate opposite to the side where the copper foil is attached is irradiated with carbon dioxide laser to form a hole through the insulating substrate to the copper foil (or conductor circuit pattern).

In case a double-sided copper-clad laminate is used to form the circuit board, the surface of the insulating substrate opposite to the side where the copper foil is attached is irradiated with carbon dioxide laser to form a hole through both the copper foil and insulating substrate to the copper foil (or conductor circuit pattern) attached on the other side of the insulating substrate, or a hole smaller in diameter than the viahole is formed by etching in the one side of the copper foil attached on the insulating layer and then carbon dioxide laser is irradiated to the smaller hole to form a hole through the insulating substrate to the copper foil (or the conductor circuit pattern) attached on the other side of the insulating substrate.

The lasering is done with the use of a pulse oscillation type carbon dioxide lasering unit for the side wall of the viahole hole to be tapered at an angle of about 60 to about 90 degrees toward the surface of the insulating substrate.

The lasering may be made with, for example, a pulse energy of about 0.5 to about 100 mJ, pulse width of about 1 to about 100 μs, pulse interval of about 0.5 ms or more and 2 to 10 shots, and with a laser under these conditions within this range, the taper angle of the side walls of the hole can be adjusted.

The diameter of the viahole hole formed under the above conditions should desirably be about 50 to about 250 μm. With a lasering under the conditions within the above-specified range, the side walls can positively be tapered and wiring density can be increased.

(3) The above laminate may be subjected to desmearing in order to remove resin residues from on the side walls and bottom of the hole formed in step (2) above.

The desmearing may be made by wet processing with acid or oxidizing agent (e.g., chromic acid or permanganic acid) or dry processing such as oxygen plasma discharge, corona discharge, ultraviolet lasering, excimer lasering or the like.

Any one of the above desmearing methods is selected taking in consideration of a residual-resin amount expected based on the type and thickness of an insulating substrate used, diameter of a viahole formed in the circuit board, lasering conditions, etc.

(4) Next, the surface of the copper foil on the desmeared insulating substrate is electrolytic plated with the copper foil being used as a plating lead to fill electrolytic copper into the hole to the full extent, to thereby form a viahole (filled via).

Note that after the electrolytic-copper plating, the electrolytic copper plate protuberant on the upper portion of the viahole in the insulating substrate may be removed and flattened by belt sanding, buffing, etching or the like as the case may be.

Also, after the copper foil is electroless-plated, it may be subjected to electrolytic plating. In this case, the copper foil may be electroless-plated with copper, nickel or silver or the like.

(5) Next, an etching resist layer is formed over the electrolytic-copper coating on the insulating substrate in the step (4) above. The etching resist layer may be formed either by applying a resist liquid or by attaching a pre-formed film of the resist liquid. A mask having a circuit pattern pre-depicted thereon is mounted on the resist layer, an etching resist layer is formed by exposing and developing the resist layer, and the metal layer in an area other than the area where the etching resist layer is not formed is etched to form a conductor circuit pattern including a conductor circuit and land.

The etchant used in the above processing should desirably be at least one selected from among aqueous solutions of sulfuric acid-hydrogen peroxide, persulfate, cupric chloride and ferric chloride.

To easily form a fine conductor circuit pattern prior to forming a conductor circuit by etching the copper foil and electrolytic-copper coating, the electrolytic-copper coating may be pre-adjusted in thickness by etching the entire surface of the coating.

The land as a part of the conductor circuit should desirably be formed to have an inside diameter generally equal to the viahole diameter or to have an outside diameter larger than the viahole diameter, so that the land diameter will be within a range of about 75 to about 350 μm. The reason for the above is that with the land diameter being within the above range, the multistage stacked vias can perform its function even if the viaholes are displaced in relation to each other.

An insulating resin layer and copper foil are stacked on one side or either side of the circuit board formed through the above steps (1) to (5) and which functions as the core of stacking. Thus, the circuit board will include one or two more insulating resin layers.

A viahole and conductor circuit are formed on the stacked insulating resin layers through similar steps to the above steps (2) to (5), and with an insulating resin layer and copper foil being stacked on the conductor layer, steps similar to the above steps (2) to (5) can be repeated to form a printed wiring board including further layers.

In the aforementioned method, the insulating resin layers are stacked sequentially to form a multilayer insulating resin layer structure. However, two or more circuit boards each including one insulating resin layer may collectively be stacked and hot-pressed to form a multilayer printed wiring board.

In the multilayer printed wiring board formed as above, the viahole formed in each of the stacked circuit boards or insulating resin layers is tapered to have an inner angle of about 60 to about 90 degrees. in relation to the surface of the circuit board or insulating resin layer in which the viahole is formed. The viaholes formed in at least one or more insulating resin layers including a circuit board as the core of stacking form together a first group while those formed in at least one or more other insulating resin layers stacked together oppositely to the insulating resin layers in which the viaholes in the first group are formed form together a second group. These first and second viahole groups form together a multistage stacked vias. Each viahole in the first and second viahole groups should desirably be tapered at an inner angle of 60 to 90 degrees. toward the surface of the insulating resin layer in which the viahole is formed.

(6) Next, a solder resist layer is formed over the surface of each of the outermost circuit boards. In this case, a solder resist composition is coated over the outer surface of the circuit board, the coating is dried, a photo mask having depicted thereon a hole for a solder pad is mounted on the dried coating, and the solder resist is exposed and developed to form a solder pad hole in which there is exposed a conductive pad portion positioned just above the viahole in the conductor circuit. In this case, a dry film of a solder resist is attached over the solder resist coating, exposed and developed or irradiated with laser light to form the solder-pad hole.

A corrosion-resistant layer of nickel, gold or the like is formed on the solder pad exposed in an area where the photomask is not formed. When it is formed from nickel-gold, the nickel layer should desirably be about 1 to about 7 μm in thickness while the gold layer should desirably be about 0.01 to about 0.1 μm in thickness. The corrosion-resistant layer may be formed from a nickel-palladium-gold alloy, gold, copper or the like in addition to the nickel-gold.

After the corrosion-resistant layer is formed, the mask layer is peeled off. Thus, a printed wiring board is provided which includes the solder pad having the corrosion-resistant layer formed thereon and the solder pad having no such corrosion-resistant layer formed thereon.

(7) Solder is supplied from the hole in the solder resist layer formed in the above step (6) to the solder pad exposed just above the viahole, melted and solidified to form a solder bump, or a conductive ball or conductive pin is joined to the solder pad with the use of a conductive adhesive or solder layer to form a multilayer circuit board.

The solder and solder layer may be supplied by solder transfer or printing.

The solder transfer is such that a solder foil is attached to over a prepreg and etched with leaving only a portion corresponding to a hole to form a solder pattern and thus a solder carrier film, a flux is applied to the hole in the solder resist on the circuit board, then the solder carrier film is stacked for the solder pattern to touch the solder pad, and it is heated for transfer of the solder.

On the other hand, the solder printing is such that a printing mask (metallic one) having a hole formed therein in a position corresponding to a solder pad is placed on the circuit board and then a solder past is printed and heated. The solder use to form such a solder bump may be an Sn—Ag solder, Sn/In solder, Sn/Zn solder or Sn/Bi solder.

EXAMPLE 1

Figure 9A:
FIGS. 9A to 9E are schematic sectional views of a multilayer printed wiring board as an embodiment 1 of the present invention, showing some steps in the manufacturing process for the multilayer printed wiring board.

(1) First, there is produced a circuit board as one unit included in a multilayer printed wiring board. The circuit board is the core of stacking a plurality of insulating layers which are to be stacked together. For producing such a circuit board, copper foils and a B-stage prepreg 12 prepared by impregnating epoxy resin into a glass cloth are stacked together and hot-pressed to form a double-sided copper-clad laminate 10 which is to be used as a starting material (as in FIG. 9A).

The prepreg or insulating substrate 12 is 60 μm in thickness and copper foils 14 are 12 μm in thickness. The copper foil 14 may be more than 12 μm in thickness. In this case, the copper foil 14 is adjusted by etching to have a thickness of 12 μm.

Figure 9B:
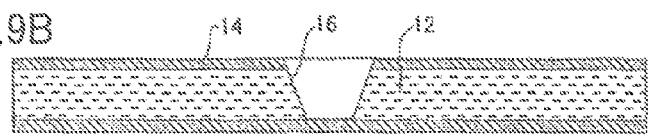

(2) The double-sided copper-clad laminate 10 including the copper foils 14 is irradiated with carbon dioxide laser to form a viahole-forming hole 16 through one of the copper foils 14 and insulating substrate 12 to the copper foil 14 on the other side of the insulating substrate 12, and then the hole formed by the lasering is desmeared by chemical processing with permanganic acid (as in FIG. 9B).

Note that in this Example, the viahole-forming hole 16 is formed using a high-peak short-pulse oscillation type carbon dioxide lasering unit (by the Hitachi Via). A copper foil on a glass cloth-based epoxy resin substrate of 60 μm in thickness having a 12 μm-thick copper foil attached thereon is irradiated directly with a laser beam under the following conditions to form a hole 16 of 75 μm in diameter at a speed of 100 holes/sec.

(Lasering Conditions)

| | |
|---|---|
| Pulse energy: | 0.5 to 100 mJ |
| Pulse width: | 1 to 100 μs |
| Pulse interval: | 0.5 ms or more |
| Number of shots: | 2 |
| Oscillating frequency: | 2000 to 3000 Hz |

The hole 16 thus formed under the above conditions has an inner wall having a generally truncated-conical shape and a taper angle (inner angle) of 65 degrees in relation to the surface of the insulating substrate 12.

Figure 9C:
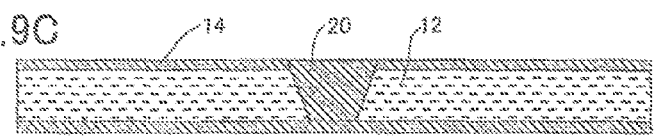

(3) The surface of the copper foil 14 having the desmeared viahole-forming hole 16 formed therein is electrolytic plated with the copper foil 14 being taken as a plating lead and under the following electrolytic plating conditions to form an electrolytic copper plated film (as in FIG. 9C):

(Electrolytic Plating Solution)

| | |
|---|---|
| Sulfuric acid: | 2.24 mol/l |
| Copper sulfate: | 0.26 mol/l |
| Additive A (reaction promoter): | 10.0 ml/l |
| Additive B (reaction inhibitor): | 10.0 ml/l |

(Electrolytic Plating Conditions)

| | |
|---|---|
| Current density: | 1 A/dm² |
| Time: | 65 min |
| Temperature: | 22 ± 2° C. |

The electrolytic copper plating in the viahole-forming hole is promoted by the additive A while the electrolytic copper plated film mainly on the copper foil is inhibited by the additive B from being formed. Also, when the electrolytic copper is fully filled in the viahole-forming hole up to nearly the same level as the surface of the copper foil 14, the additive B will adhere to the copper foil 14 to inhibit the electrolytic copper plated film from being formed as on the copper foil.

Thus, there is formed a viahole 20 having the electrolytic copper filled in the hole 16 so that the surface of the viahole 20 will be nearly flush with the copper foil surface.

Also, the conductor layer of the copper foil 14 and electrolytic copper plated film may be adjusted in thickness by etching. The thickness of the conductor layer may be adjusted in thickness by a physical method such as the sand-belt polishing or buffing.

Figure 9D:

(4) At either side of the circuit board formed as in the step (3) above, a dry film of a photoresist is formed to a thickness of 15 to 20 μm on the conductor layer of the copper foil 14 and electrolytic copper plated film. A mask having depicted thereon a conductor circuit including a viahole land is mounted on the resist film, and the resist film is exposed and developed to form an etching resist layer 22 (as in FIG. 9D). The copper foil 14 and electrolytic copper plated film exposed in a portion where the etching resist is not formed are dissolved and removed by etching with an etching solution of hydrogen peroxide liquid/sulfuric acid.

Figure 9E:
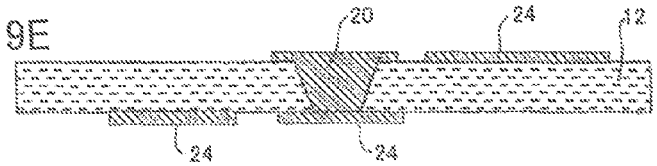

(5) Thereafter, the etching resist layer 22 is peeled using an alkaline solution to form a pattern 24 of a conductor circuit including a viahole land. Thus, there is formed a viahole 20 electrically connecting the conductor circuits on both the front and rear sides of the circuit board to each other to provide a circuit board in which the viahole 20 and a copper foil portion forming the conductor circuit 24 are flat (as in FIG. 9E).

Figure 10A:
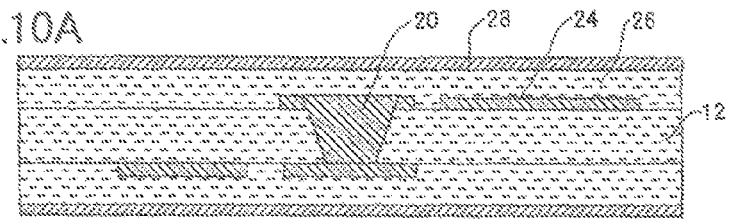
FIGS. 10A to 10E are schematic sectional views of the multilayer printed wiring board as the embodiment 1 of the present invention, showing some other steps in the manufacturing process for the multilayer printed wiring board.

(6) At the front and rear sides of the circuit board formed through the above steps (1) to (5), there are superposed a 60 μm-thick B-stage prepreg prepared by impregnating epoxy resin into a glass cloth and 12 μm-thick copper foils. The prepreg and copper foils are hot-pressed at a temperature of 80 to 250° C. and under a pressure of 1.0 to 5.0 kgf/cm² to stack 60 μm-thick insulating resin layers 26 and 12 μm-thick conductor layers 28 on the circuit board (as in FIG. 10A).

Figure 10B:
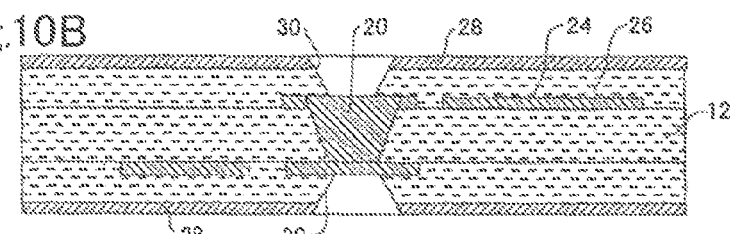

(7) Next, nearly as in the step (2) above, the circuit board is irradiated at either side thereof with carbon dioxide laser under the following conditions to form a 65 μm-diameter viahole-forming hole 30 through the insulating resin layer 26 and conductor layer 28 to the lower conductor circuit 24 at a speed of 100 holes/sec. Then, the hole formed by the lasering is desmeared by chemical processing with permanganic acid (as in FIG. 10B).

(Lasering Conditions)

| | |
|---|---|
| Pulse energy: | 0.5 to 100 mJ |
| Pulse width: | 1 to 100 μs |
| Pulse interval: | 0.5 ms or more |
| Number of shots: | 2 |
| Oscillating frequency: | 2000 to 3000 Hz |

The hole 30 thus formed under the above conditions has an inner wall having a generally truncated-conical shape and a taper angle (inner angle) of 65 degrees in relation to the surface of the insulating resin layer 26.

Figure 10C:
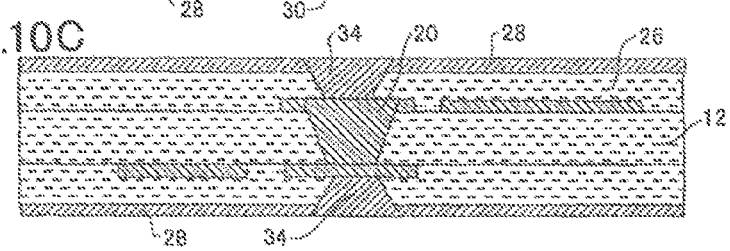

(8) Nearly as in the step (3) above, the conductor layer 28 at the side of the desmeared viahole-forming hole 28 is electrolytic plated under the following electrolytic plating conditions to form an electrolytic copper plated film 32 (as in FIG. 10C):

(Electrolytic Plating Solution)

| | |
|---|---|
| Sulfuric acid: | 2.24 mol/l |
| Copper sulfate: | 0.26 mol/l |
| Additive A (reaction promoter): | 10.0 ml/l |
| Additive B (reaction inhibitor): | 10.0 ml/l |

(Electrolytic Plating Conditions)

| | |
|---|---|
| Current density: | 1 A/dm² |
| Time: | 65 min |
| Temperature: | 22 ± 2° C. |

Thus, a viahole 34 having an electrolytic copper 32 filled in the hole 30 is formed so that the surface of the viahole 34 will generally be flush with the copper foil surface.

Figure 10D:
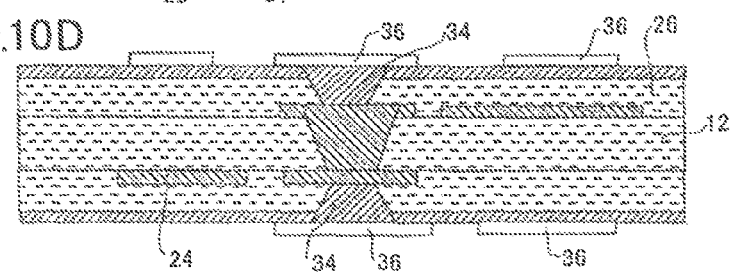

(9) Nearly as in the step (4) above, a dry film of a photoresist is formed to a thickness of 15 to 20 μm on the electrolytic copper plated layer formed in the above step (8). A mask having depicted thereon a conductor circuit, land of the viahole 34, etc. is mounted on the resist film, a second positioning mark is imaged by a camera, and the resist film is exposed and developed to form an etching resist layer 36 (as in FIG. 10D).

Thereafter, the electrolytic copper plated film and copper foil corresponding to a portion where the etching resist is not formed are removed by etching with an etching solution of hydrogen peroxide liquid/sulfuric acid.

Figure 10E:
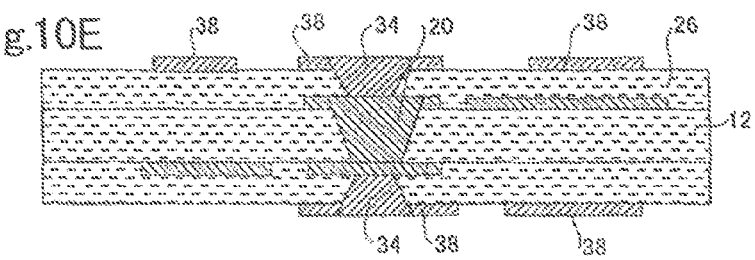

(10) Next, the etching resist layer 36 is peeled using an alkaline solution to form a conductor circuit 38 including the viahole 34 and land of the latter. Thus, there is formed a circuit board in which the viahole 34 electrically connecting both the front and rear sides of the circuit board to each other and a copper foil portion forming the conductor circuit 38 are flat (as in FIG. 10E).

Further, the above steps (6) to (10) are repeated to form one more insulating resin layer 40, an electrolytic copper is filled by plating into a hole formed in the insulating resin layer 40 to form a viahole 42 and also a conductor circuit pattern 44 including a viahole land. Thus, there can be provided a multilayer printed wiring board in which two insulating layers and conductor circuits are formed on either side of the double-sided circuit board 10 (as in FIG. 11).

More specifically, the multilayer printed wiring board includes five insulating layers and six conductor circuits. In this multilayer printed wiring board, the viaholes formed in the double-side circuit board and two insulating layers stacked on the upper side of the double-sided circuit board form together a first group of viaholes each having a truncated-conical section tapered at an angle of 65 degrees. toward the surface of the insulating layer, and the viaholes formed in two insulating layers stacked on the lower side of the double-sided circuit board form together a second group of viaholes each having a truncated-conical section taped at an angle of 65 degrees. toward the surface of the insulating layer. These first and second viahole groups are disposed opposite to each other and stacked on almost same straight lines, respectively.

(11) A solder resist layer 46 is formed on the surface of each of two insulating layers on the outermost sides, respectively, of the circuit board formed in the step (10) above to form a solder resist layer 46.

First, a film-shaped solder resist of 20 to 30 μm in thickness is attached on the insulating layer having the conductor circuit 38 formed thereon. Next, the insulating layer is dried at 70° C. for 20 min and then at 100° C. for 30 min, and then a 5 mm-thick soda lime glass substrate having depicted thereon, with a chrome layer, a circle pattern (mask pattern) for a hole in the solder resist is attached at the side thereof having the chrome layer closely to the solder resist layer 46, exposed to ultraviolet rays of 1000 mJ/cm$^2$ and DMTG-developed.

Further, the above assembly is heated at 120° C. for 1 hour and then at 150° C. for 3 hours to form a 20 μm-thick solder resist layer 46 having a hole 48 (200 μm in diameter) corresponding to a pad (as in FIG. 12A).

Before the solder resist layer 46 is formed over the surface of the outermost insulating layer of the multilayer printed wiring board, a roughed-surface layer may be provided as necessary.

(12) Next, the circuit board having the solder resist layer 46 formed thereon is immersed in an electroless nickel plating solution containing 30 g/l of nickel chloride, 10 g/l of nickel chloride, 10 g/l of sodium hypophosphite and 10 g/l of sodium citrate and having a pH value of 5 for 20 min to form a 5 mg-thick nickel plated layer on the surface of the conductor circuit 38 exposed from the hole 48.

Further, the circuit board is immersed in an electroless nickel plating solution containing 2 g/l of potassium gold cyanide, 75 g/l of ammonium chloride, 50 g/l of sodium citrate and 10 g/l of sodium hypophosphite at 93° C. for 23 sec to form a 0.03 μm-thick gold plated layer on the nickel plated layer, to thereby form a conductor pad 50 covered with a metal layer consisting of the nickel and gold plated layers.

(13) Then, with a metal mask being mounted on the solder resist layer 46, a solder paste of Sn/Pb or Sn/Ag/Cu having a melting point T2 of 183° C. is printed. The metal mask is removed from on the solder resist layer 46, and then the solder paste is subjected to reflowing at a temperature of about 183° C. to provide a multilayer printed wiring board having a solder layer 52 formed on the conductor pad 50 exposed in the hole 48 (as in FIG. 12B).

Next, mainly electronic components such as a capacitor, resistor and the like are mounted in an area where the solder layer 52 is formed, and external terminals such as a key pad and the like are mounted in an area where the solder layer 52 is not formed. Thus, a multilayer printed wiring board is provided.

EXAMPLE 2

A multilayer printed wiring board is produced generally similarly to the Example 1 except that each of the viaholes included in the first and second viahole groups formed in the insulating layers, respectively, stacked on the front and rear sides, respectively, of the double-sided copper-clad laminate are shifted about a half of the viahole diameter from each other as shown in FIG. 3A.

EXAMPLE 3

A multilayer printed wiring board is produced generally similarly to the Example 1 except that each of the viaholes included in the first viahole group formed in the insulating layer stacked on the upper side of the double-side copper-clad laminate and those included in the second viahole group formed in the insulating layer stacked on the lower side of the double-sided copper-clad laminate are shifted about a half of the viahole diameter from each other, as shown in FIG. 3B.

EXAMPLE 4

A multilayer printed wiring board is produced generally similarly to the Example 1 except that two insulating layers are stacked on the upper side of the double-sided copper-clad laminate while one insulating layer is stacked on the lower side of the double-sided copper-clad laminate so that four insulating layers and five conductor circuits are formed.

EXAMPLE 5

A multilayer printed wiring board is produced generally similarly to the Example 2 except that two insulating layers are stacked on the upper side of the double-sided copper-clad laminate while one insulating layer is stacked on the lower side of the double-sided copper-clad laminate so that four insulating layers and five conductor circuits are formed.

EXAMPLE 6

A multilayer printed wiring board is produced generally similarly to the Example 3 except that two insulating layers are stacked on the upper side of the double-sided copper-clad laminate while one insulating layer is stacked on the lower side of the double-sided copper-clad laminate so that four insulating layers and five conductor circuits are formed.

EXAMPLE 7

A multilayer printed wiring board is produced generally similarly to the Example 1 except that the first viahole group formed in the insulating layers stacked on the double-sided copper-clad laminate and on the upper side of the latter is horizontally shifted generally a half of the viahole diameter from the second viahole group formed in the insulating layers stacked on the lower side of the double-sided copper-clad laminate, as shown in FIG. 4.

EXAMPLE 8

A multilayer printed wiring board is produced generally similarly to the Example 7 except that two insulating layers are stacked on the upper side of the double-sided copper-clad laminate while one insulating layer is stacked on the lower side of the double-sided copper-clad laminate so that four insulating layers and five conductor circuits are formed.

EXAMPLE 9

A multilayer printed wiring board is produced generally similarly to the Example 4 except that the viaholes are stacked together for those included in the first group to be positioned at the respective apexes of an imaginary tetragonal lattice (lattice interval: 10 mm) on the insulating substrate and those included in the second group to be positioned at the center of the imaginary tetragonal lattice, as shown in FIG. 5B.

EXAMPLE 10

A multilayer printed wiring board is produced generally similarly to the Example 4 except that the viaholes are stacked together for those included in the first group to be positioned at the respective apexes of an imaginary triangular lattice (lattice interval: 20 mm) on the insulating substrate and those included in the second group to be positioned at the center of the imaginary triangular lattice, as shown in FIG. 6.

EXAMPLE 11

Figure 8A:
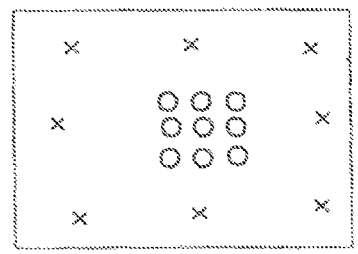
FIGS. 8A and 8B schematically illustrate other examples of disposition in plane of viaholes included in a multistage stacked vias (concentrated disposition and dispersed disposition).
Figure 8B:
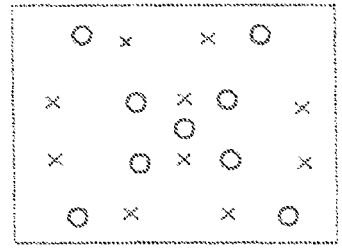

A multilayer printed wiring board is produced generally similarly to the Example 4 except that the viaholes are stacked together for those included in the first group to be positioned nearly at the center of the insulating substrate and concentrically disposed in an area of 40×40 mm and those included in the second group to be positioned outside the central area of a peripheral area (40×40 mm) surrounding the central portion and inside an area of 70×100 mm, as shown in FIG. 8A.

What is claimed is:

1. A multilayer printed wiring board comprising:
   a plurality of insulating layers;
   a plurality of conductor layers stacked alternately over the insulating layers, respectively; and
   a plurality of viaholes formed in the insulation layers and electrically connecting the conductor layers through the insulation layers,
   wherein the viaholes include a first group of viaholes and a second group of viaholes, the viaholes in the first group are tapered toward the viaholes in the second group, the viaholes in the second group are tapered toward the viaholes in the first group, the viaholes in the first group and the the viaholes in the second group are formed in the insulating layers, respectively, the viaholes are formed by plating a plurality of openings formed after lamination of respective ones of the insulating layers, and each of the insulating layers is about 100 μm or less in thickness.

2. The multilayer printed wiring board according to claim 1, wherein the viaholes in the first group are stacked directly on top of each other, and the viaholes in the second group are stacked directly on top of each other.

3. The multilayer printed wiring board according to claim 1, wherein the first group of viaholes is stacked such that the first group of viaholes is shifted in relation to the second group of viaholes in a direction substantially orthogonal to a direction of thickness of the insulating layers.

4. The multilayer printed wiring board according to claim 1, wherein the viaholes in the first group are stacked offset on top of each other, and the viaholes in the second group are stacked offset on top of each other.

5. A multilayer printed wiring board comprising:
   a plurality of insulating layers including an outermost insulating layer;
   a plurality of conductor layers stacked alternately over the insulating layers, respectively; and
   a plurality of viaholes formed in the insulation layers and electrically connecting the conductor layers through the insulation layers,
   wherein the viaholes include a first group of viaholes and a second group of viaholes, the viaholes in the first group are tapered toward the viaholes in the second group, the viaholes in the second group are tapered toward the viaholes in the first group, the viaholes are formed by plating a plurality of openings formed after lamination of respective ones of the insulating layers, each of the insulating layers is about 100 μm or less in thickness, and the viaholes in the first group are stacked on top of each other and include a viahole formed in the outermost insulating layer.

6. The multilayer printed wiring board according to claim 5, wherein the viaholes in the first group are stacked directly on top of each other, and the viaholes in the second group are stacked directly on top of each other.

7. The multilayer printed wiring board according to claim 5, wherein the first group of viaholes is stacked such that the first group of viaholes is shifted in relation to the second group of viaholes in a direction substantially orthogonal to a direction of thickness of the insulating layers.

8. The multilayer printed wiring board according to claim 5, wherein the viaholes in the first group are stacked offset on top of each other, and the viaholes in the second group are stacked offset on top of each other.

9. A multilayer printed wiring board comprising:
   a plurality of insulating layers;
   a plurality of conductor layers stacked alternately over the insulating layers, respectively; and
   a plurality of viaholes formed in the insulation layers and electrically connecting the conductor layers through the insulation layers,
   wherein the viaholes include a first group of viaholes and a second group of viaholes, the viaholes in the first group are tapered toward the viaholes in the second group, the viaholes in the second group are tapered toward the viaholes in the first group, the conductor layers include a conductor layer on which the viaholes in the first group and the viaholes in the second group are stacked, the viaholes are formed by plating a plurality of openings formed after lamination of respective ones of the insulating layers, and each of the insulating layers is about 100 μm or less in thickness.

10. The multilayer printed wiring board according to claim 9, wherein the viaholes in the first group are stacked directly on top of each other, and the viaholes in the second group are stacked directly on top of each other.

11. The multilayer printed wiring board according to claim 9, wherein the first group of viaholes is stacked such that the first group of viaholes is shifted in relation to the second group of viaholes in a direction substantially orthogonal to a direction of thickness of the insulating layers.

12. The multilayer printed wiring board according to claim 9, wherein the viaholes in the first group are stacked offset on top of each other, and the viaholes in the second group are stacked offset on top of each other.

13. A multilayer printed wiring board comprising:
   a plurality of insulating layers;
   a plurality of conductor layers stacked alternately over the insulating layers, respectively; and
   a plurality of viaholes formed in the insulation layers and electrically connecting the conductor layers through the insulation layers,
   wherein the viaholes include a first group of viaholes and a second group of viaholes, the viaholes in the first group are tapered toward the viaholes in the second group, the viaholes in the second group are tapered toward the viaholes in the first group, the insulating layers are divided into a first side in which the viaholes in the first group are formed and a second side in which the the viaholes in the second group are formed, the viaholes are formed by plating a plurality of openings formed after lamination of respective ones of the insulating layers, and each of the insulating layers is about 100 μm or less in thickness.

14. The multilayer printed wiring board according to claim 13, wherein the viaholes in the first group are stacked directly on top of each other, and the viaholes in the second group are stacked directly on top of each other.

15. The multilayer printed wiring board according to claim 13, wherein the first group of viaholes is stacked such that the first group of viaholes is shifted in relation to the second group of viaholes in a direction substantially orthogonal to a direction of thickness of the insulating layers.

16. The multilayer printed wiring board according to claim 13, wherein the viaholes in the first group are stacked offset on top of each other, and the viaholes in the second group are stacked offset on top of each other.

17. A multilayer printed wiring board comprising:
a plurality of insulating layers;
a plurality of conductor layers stacked alternately over the insulating layers, respectively; and
a plurality of viaholes formed in the insulation layers and electrically connecting the conductor layers through the insulation layers,
wherein the viaholes include a first group of viaholes and a second group of viaholes, the viaholes in the first group are tapered toward the viaholes in the second group such that the viaholes in the first group decrease viahole sizes in a direction toward the viaholes in the second group, respectively, the viaholes in the second group are tapered toward the viaholes in the first group, the viaholes in the first group and the the viaholes in the second group are formed in the insulating layers, respectively, the viaholes are formed by plating a plurality of openings formed after lamination of respective ones of the insulating layers, and each of the insulating layers are about 100 μm or less in thickness.

18. The multilayer printed wiring board according to claim 17, wherein the viaholes in the first group are stacked directly on top of each other, and the viaholes in the second group are stacked directly on top of each other.

19. The multilayer printed wiring board according to claim 17, wherein the first group of viaholes is stacked such that the first group of viaholes is shifted in relation to the second group of viaholes in a direction substantially orthogonal to a direction of thickness of the insulating layers.

20. The multilayer printed wiring board according to claim 17, wherein the viaholes in the first group are stacked offset on top of each other, and the viaholes in the second group are stacked offset on top of each other.

* * * * *